United States Patent
Zoels et al.

(10) Patent No.: US 9,425,786 B2
(45) Date of Patent: Aug. 23, 2016

(54) SYSTEM AND METHOD FOR DRIVING A POWER SWITCH

(71) Applicant: General Electric Company, Schenectady, NY (US)

(72) Inventors: Thomas Alois Zoels, Unterschleissheim (DE); Alvaro Jorge Mari Curbelo, Oberschleissheim (DE); Miguel Garcia Clemente, Munich (DE)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/542,680

(22) Filed: Nov. 17, 2014

(65) Prior Publication Data

US 2016/0142048 A1    May 19, 2016

(51) Int. Cl.
| | |
|---|---|
| H03K 17/16 | (2006.01) |
| H03K 3/00 | (2006.01) |
| H03K 17/567 | (2006.01) |
| H03K 17/687 | (2006.01) |

(52) U.S. Cl.
CPC ............ *H03K 17/567* (2013.01); *H03K 17/687* (2013.01)

(58) Field of Classification Search
USPC .................. 327/108–112, 423, 427, 434–437
See application file for complete search history.

(56) References Cited

U.S. PATENT DOCUMENTS

| | | | |
|---|---|---|---|
| 5,877,646 A | 3/1999 | Joerg | |
| 6,208,185 B1 * | 3/2001 | John | .................. H03K 17/0406 327/170 |
| 6,271,709 B1 | 8/2001 | Kimura et al. | |
| 6,556,062 B1 | 4/2003 | Wallace | |
| 7,061,195 B2 | 6/2006 | Ho et al. | |
| 7,274,243 B2 * | 9/2007 | Pace | ...................... H02M 7/538 327/396 |
| 7,405,528 B2 | 7/2008 | Ho et al. | |
| 7,696,808 B2 | 4/2010 | Wong et al. | |
| 8,138,818 B2 | 3/2012 | Tsunoda et al. | |
| 8,362,812 B2 * | 1/2013 | Lee | ......................... H02M 1/08 327/109 |

(Continued)

FOREIGN PATENT DOCUMENTS

| | | |
|---|---|---|
| DE | 102006034351 A1 | 2/2008 |
| JP | 2000232347 A | 8/2000 |

(Continued)

OTHER PUBLICATIONS

Musumeci et al., "Switching-Behavior Improvement of Insulated Gate-Controlled Devices", Power Electronics, IEEE Transactions on, Issue Date: Jul. 1997, vol. 12, Issue: 4 ,pp. 645-653.

(Continued)

*Primary Examiner* — An Luu
(74) *Attorney, Agent, or Firm* — Seema S. Katragadda

(57) ABSTRACT

A gate driver circuit for the power switch is disclosed. The gate driver circuit includes a resistor network coupled to the power switch. The resistor network includes a plurality of resistors and a control unit operatively coupled to the resistor network. The control unit detects an occurrence of a commutation phase and a saturation phase based on an identity of the power switch and corresponding time stamps associated with a start of a delay phase, the commutation phase, and the saturation phase. The control unit further controls the resistor network to provide different resistance values in at least two of a delay phase, a commutation phase, and a saturation phase when the power switch is transitioned to a first state. A method for driving the power switch is also disclosed.

21 Claims, 10 Drawing Sheets

(56) References Cited

U.S. PATENT DOCUMENTS

| | | | |
|---|---|---|---|
| 8,717,069 B2 * | 5/2014 | Curbelo | ............... H03K 17/163 |
| | | | 327/108 |
| 2008/0122497 A1 | 5/2008 | Ishikawa et al. | |
| 2012/0230076 A1 | 9/2012 | Palmer et al. | |
| 2013/0257177 A1 | 10/2013 | Jacobson et al. | |
| 2014/0015571 A1 | 1/2014 | Wagoner et al. | |

FOREIGN PATENT DOCUMENTS

| | | |
|---|---|---|
| JP | 2005278274 A | 10/2005 |
| WO | 2007068396 A1 | 6/2007 |

OTHER PUBLICATIONS

Lihua., "IClosed-Loop Gate Drive for High Power IGBTs", Applied Power Electronics Conference and Exposition, 2009. APEC 2009. Twenty-Fourth Annual IEEE, Feb. 15-19, 2009, pp. 1331-1337.

Fink., "Advanced Gate Drive Unit With Closed-Loop dic/dt Control", Power Electronics, IEEE Transactions on (vol. 28 , Issue: 5), May 2013, pp. 2587-2595.

Musumeci.,"A New Adaptive Driving Technique for High Current Gate Controlled Devices", Applied Power Electronics Conference and Exposition, 1994. APEC '94. Conference Proceedings 1994., Ninth Annual,vol. 1, Feb. 13-17, 1994, pp. 480-486.

European Search Report and Opinion issued in connection with Corresponding EP Application No. 15194898.1 on Apr. 4, 2016.

* cited by examiner

US 9,425,786 B2

1

SYSTEM AND METHOD FOR DRIVING A POWER SWITCH

BACKGROUND

Embodiments of the present specification relate to semiconductor power switches, and more particularly to a gate driver circuit for controlling switching of the semiconductor power switches.

Power switches such as insulated gate bipolar transistors (IGBTs), reverse conducting IGBTs, bi-mode insulated gate transistors (BiGTs), metal-oxide-semiconductor field-effect transistors (MOSFETs), and the like, have been used in applications that entail use of high power, high voltage, or high current. Some examples of such applications include, but are not limited to, power converters such as inverters, rectifiers, choppers, and Direct Current (DC)-DC converters. In these applications, switching timing of the power switches employed therein play an important role in the performance of the power converters.

A power switch module such as an IGBT module typically includes a freewheeling diode coupled in antiparallel with an insulated gate bipolar transistor (IGBT). Moreover, transitioning the IGBT to an ON-state includes three phases, such as a delay phase, a commutation phase, and a saturation phase. Therefore, a "switch-on" time of the IGBT is a sum of durations of the delay phase, the commutation phase, and the saturation phase.

As will be appreciated, a gate driver circuit aids in controlling the switching of the power switches used in the power switch modules which may in turn be employed in an inverter circuit, for example. The power switches used in the inverter circuit may include IGBTs. A gate driver circuit is typically employed to control gate voltages of the IGBTs for controlling the switching of the IGBTs in the inverter circuit.

In operation, the gate driver circuit supplies a gate voltage to a gate terminal of the IGBT through a resistor (hereinafter referred to as a gate resistor). Typically, the value of the gate resistor is a fixed value. For example, the gate resistor may be selected such that the IGBT performs satisfactorily in a worst case condition. More particularly, the value of the gate resistor is typically selected such that the freewheeling diode in the IGBT module is protected from stresses induced in the commutation phase. Such a value of the gate resistor thus aids in maintaining a lower slew rate of a current flowing through the freewheeling diode and thereby protects the freewheeling diode. However, use of such fixed configured gate resistors also leads to decreased performance of the IGBT in the delay phase and the saturation phase due to long delay times and high switching losses. Moreover, such decreased performance of the IGBT in the delay phase and saturation phase hampers operability of the gate driver circuit in applications where high speed switching is required. As faster switching time is a factor in many applications aimed at higher efficiency, the industry requires gate drivers that do not suffer from the noted deficiencies.

BRIEF DESCRIPTION

In accordance with aspects of the present specification, a gate driver circuit for a power switch is disclosed. The gate driver circuit includes a resistor network coupled to the power switch. The resistor network includes a plurality of resistors. The gate driver circuit further includes a control unit operatively coupled to the resistor network. The control unit is configured to control the resistor network such that the resistor network provides different resistance values in at least two

2 of a delay phase, a commutation phase, and a saturation phase when the power switch is transitioned to a first state.

In accordance with another aspect of the present specification, a method for driving a power switch is disclosed. The method includes determining an occurrence of a delay phase, a commutation phase, and a saturation phase when the power switch is transitioned to an ON-state. The method further includes controlling a resistor network coupled to the power switch such that the resistor network provides different resistance values in at least two of the delay phase, the commutation phase, and the saturation phase when the power switch is transitioned to the ON-state, where the resistor network comprises a plurality of resistors.

In accordance with yet another aspect of the present specification, a gate driver circuit for driving a power switch is disclosed. The gate driver circuit includes a variable current source coupled to the power switch. The variable current source is configured to supply a driving strength to the power switch. Moreover, the gate driver circuit includes a control unit operatively coupled to the variable current source. The control unit is configured to control the variable current source such that different driving strengths are supplied in at least two of a delay phase, a commutation phase, and a saturation phase when the power switch is transitioned to an ON-state.

DRAWINGS

These and other features, aspects, and advantages of the present specification will become better understood when the following detailed description is read with reference to the accompanying drawings in which like characters represent like parts throughout the drawings, wherein.

DETAILED DESCRIPTION

The specification may be best understood with reference to the detailed figures and description set forth herein. Various embodiments are described hereinafter with reference to the figures. However, those skilled in the art will readily appreciate that the detailed description given herein with respect to these figures is just for explanatory purposes as the method and the system extend beyond the described embodiments.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

Figure 1:
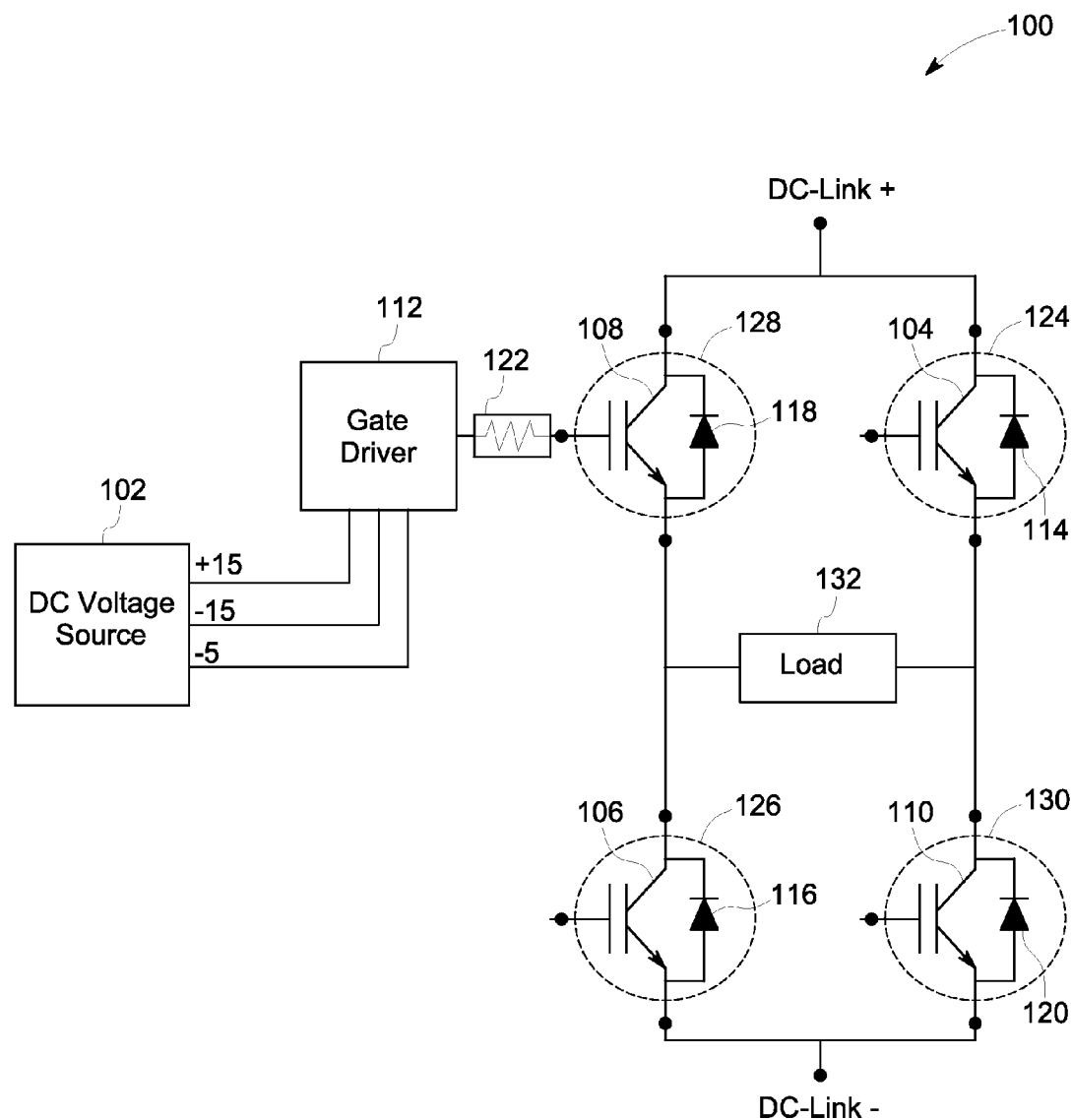
FIG. 1 is a schematic diagram of a conventional inverter circuit.

FIG. 1 is a schematic diagram of a conventional inverter circuit 100. The inverter circuit 100 includes an arrangement of a direct current (DC) voltage source 102 and one or more power switch modules, such as IGBT modules 124, 126, 128, and 130. The IGBT modules 124, 126, 128, and 130 are hereinafter collectively referred to as IGBT modules 124-130. The IGBT modules 124-130 may include IGBTs 104, 106, 108, 110, respectively. The IGBTs 104, 106, 108, 110 are hereinafter collectively referred to as IGBTs 104-110. Moreover, in some embodiments, the IGBT modules 124-130 may also include freewheeling diodes 114, 116, 118, and 120 coupled in antiparallel between respective collector terminals and emitter terminals of the IGBTs 104, 106, 108, 110, as depicted in FIG. 1.

The DC voltage source 102 may include a battery, a DC-DC power supply, or any other energy source capable of supplying a DC voltage. The DC voltage source 102 may supply more than one voltage level. By the way of example, output voltage levels from the DC voltage source 102 may include gate supply voltages of −15 volts and +15 volts, and a biasing voltage for a gate driver unit 112.

The IGBT modules 124-130 are coupled to a DC-link. Voltage from the DC-link is used for operating the IGBT modules 124-130. As shown in FIG. 1, in the inverter circuit 100, the IGBT modules 124-130 are shown as being coupled in a standard H-bridge configuration. More particularly, collector terminals of the IGBTs 104 and 108 are coupled to a positive terminal of the DC-link. Moreover, emitter terminals of the IGBTs 106 and 110 are coupled to a negative terminal of the DC-link, as depicted in FIG. 1. However, the emitter terminals of the IGBTs 106 and 110 may be grounded. Additionally, an emitter terminal of the IGBT 104 may be electrically coupled to a collector terminal of the IGBT 110. Similarly, an emitter terminal of the IGBT 108 may be electrically coupled to a collector terminal of the IGBT 116.

The inverter circuit 100 is generally coupled to a load 132. More particularly, the load 132 is coupled between the emitter terminals of the IGBTs 104 and 108. The load 132 may be representative of any electrical equipment, for example, household or industrial electrical devices.

Furthermore, the inverter circuit 100 may include one or more gate driver units, such as the gate driver unit 112 coupled to a gate terminal of the IGBT 108 through a gate resistor 122. Typically, the gate driver unit 112 is configured to control a gate voltage ($V_g$) of the IGBT 108 in order to control the switching of the IGBT 108 between ON and OFF-states.

Typically, an IGBT is said to be in a "first state", "ON-state", or "switched on" when a value of a collector to emitter voltage ($V_{CE}$) of the IGBT becomes substantially equal a value of a forward voltage drop of the IGBT and the corresponding freewheeling diode is not conducting. Typically, the value of the forward voltage drop of the IGBT is in the order of a few hundred millivolts up to a few volts. Moreover, the IGBT is said to be in a "second state", "OFF-state", or "switched off" when the value of the collector to emitter voltage ($V_{CE}$) of the IGBT is substantially close to the DC-link voltage and the corresponding freewheeling diode is not conducting. Moreover, a term "switch-on time" is used to refer to time taken to transition the IGBT to the ON-state from the OFF-state. Similarly, a term "switch-off time" is used to refer to time taken to transition the IGBT to the OFF-state from the ON-state.

The gate driver unit 112 is configured to apply the gate voltage ($V_g$) to the gate terminal of the IGBT 108 through the gate resistor 122. The gate resistor 122 is at a fixed value and hard configured between the gate driver unit 112 and the gate terminal of the IGBT 108. Although, the gate resistor 122 is shown as being coupled between the gate driver unit 112 and the gate terminal of the IGBT 108, the gate resistor 122 may be disposed within the gate driver unit 112. In one example, the gate resistor 122 is chosen such that slew rate of a current flowing through the freewheeling diode 116 corresponding to the IGBT 106 is maintained at a low value to protect the freewheeling diode 116 when commutating a current from the freewheeling diode 116 to the IGBT 108. By the way of example, the gate resistor 122 may have a value of about 5 ohms. In FIG. 1, only one gate driver unit 112 is shown for the purpose of illustration and brevity. As will be appreciated, additional such gate driver units may also be coupled to the gate terminals of the other IGBTs 104, 106, and 110 to control switching of the respective IGBTs.

The switching of each of the IGBTs 104-110 is selectively controlled by the respective gate driver units, such as the gate driver unit 112. In the inverter circuit 100, the switching of the IGBTs 104-110 is controlled such that an alternating current (AC) voltage appears across the load 132. In order to obtain the AC voltage across the load 132, the gate driver unit 112 may transition the IGBTs 104 and 106 to the ON-state, while the IGBTs 108 and 110 are maintained in an OFF-state. In such an instance, a current from the positive terminal of the DC-link flows through the IGBT 104, the load 132, and the IGBT 106. Thus, a negative voltage appears across the load 132.

Typically, the IGBTs 104 and 106 may be switched off prior to switching the IGBTs 108 and 110 to the ON-state. During the period when the IGBTs 104 and 106 are switched off and before the IGBTs 108 and 110 are switched on, the current flowing through the load 132 is interrupted. An inductive load, such as the load 132, opposes a sudden interruption of the current flowing therethrough. More particularly, the load 132 tries to maintain the flow of the current. However, since all the IGBTs 104-110 are in the OFF-state, the current from the load 132 flows through a forward biased freewheeling diode 118 to the DC-link.

When the IGBTs 108 and 110 are transitioned to the ON-state, the current from the positive terminal of the DC-link flows through the IGBT 108, the load 132, and the IGBT 110. Thus, a positive voltage appears across the load 132. Such a periodical switching of the IGBTs 104-110 generates an AC voltage across the load 132.

The current flowing through the freewheeling diode 116 and the current flowing through the load 132 constitutes the current flowing thought IGBT 108. Typically, the current flowing though the load 132 remains constant. Therefore, when the IGBT 108 is being transitioned to the ON-state, the current flowing through the IGBT 108 (typically in a commutation phase) may in turn impact the freewheeling diode 116. Hence, the slew rate of the current flowing through the freewheeling diode 116 needs to be controlled to protect the freewheeling diode 116. Similarly, such a current also flows through the freewheeling diodes 118, 114, and 120 when the IGBTs 106, 110, and 104 are transitioning to an ON-state, respectively.

Figure 2:
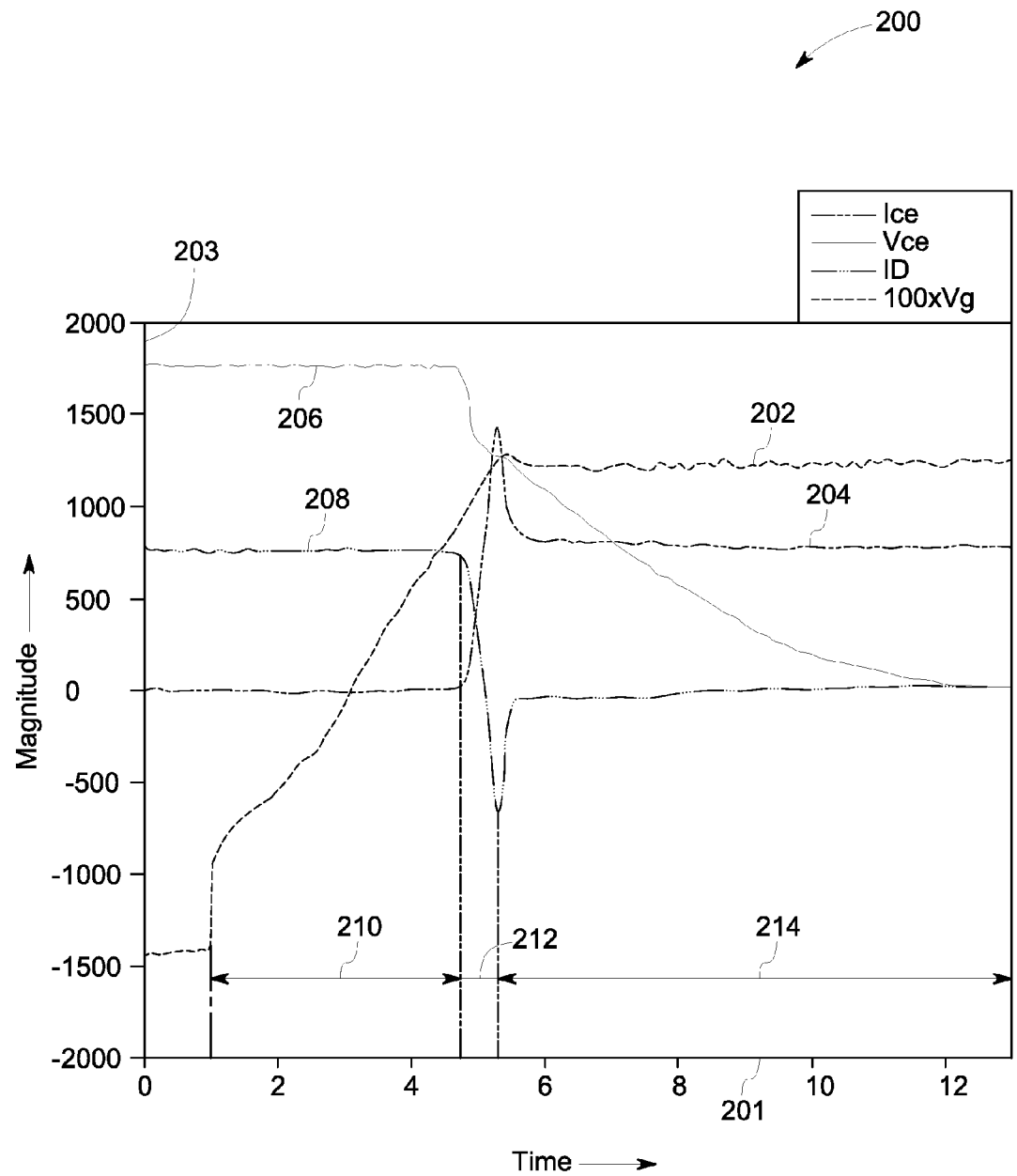
FIG. 2 is a graphical illustration of time responses of various parameters of a power switch used in an inverter circuit of FIG. 1 when the power switch is transitioned to an ON-state.

FIG. 2 is a graphical illustration 200 of time responses of various parameters of a power switch module such as the IGBT module 128 of FIG. 1 during a transition of the IGBT 108 to an ON-state. The time responses depicted in FIG. 2 are described with respect to FIG. 1. For the purpose of illustration and brevity, the time responses corresponding to the IGBT module 128 are depicted in FIG. 2. Other IGBT modules 124, 126, and 130 may also have similar time responses during their respective transitions to an ON-state.

More particularly, the graphical illustration 200 depicts time responses of the gate voltage ($V_g$) 202, a collector to emitter current ($I_{CE}$) 204, and a collector to emitter voltage ($V_{CE}$) 206 of the IGBT 108. The graphical illustration 200 also depicts a time response 208 of a current flowing through the freewheeling diode 116 ($I_D$). In the graphical illustration 200, the X-axis 201 represents time in microseconds and the Y-axis 203 represents values of the gate voltage ($V_g$), the collector to emitter current ($I_{CE}$), the collector to emitter voltage ($V_{CE}$) of the IGBT 108, and the current flowing through the freewheeling diode 116 ($I_D$). It may be noted that, the time response of the gate voltage ($V_g$) 202 of the IGBT 108 is depicted using scaled up values. In one example, the values of the gate voltage ($V_g$) of the IGBT 108 may be scaled up by about 100.

During a transition to the first state, the IGBT 108 cycles through a delay phase, a commutation phase, and a saturation phase. In one embodiment, the first state is the ON-state. Therefore, a "switch-on time" of the IGBT 108 may be equal to the sum of the durations of the delay phase (alternatively known as a pre-boosting phase), the commutation phase, and the saturation phase (alternatively known as a boosting phase).

Referring to the time response 202 of the gate voltage ($V_g$), the delay phase starts when the gate voltage ($V_g$) begins to rise and ends when the gate voltage ($V_g$) reaches a threshold voltage of the IGBT 108. In one example, the threshold voltage of the IGBT 108 may be 6 volts. The duration of the delay phase is represented by reference numeral 210. During the delay phase, the IGBT 108 does not conduct. The slew rate of the rise of the gate voltage ($V_g$) depends on the resistance of the gate resistor 122. For example, lower the resistance of the gate resistor 122, faster the slew rate of the rise of the gate voltage ($V_g$). However, as noted previously, the value of the gate resistor 122 is selected to protect the freewheeling diode 116. Consequently, as depicted in FIG. 2, the duration of the delay phase 210 is significantly large. Such a large duration of the delay phase 210 contributes to an increase in the switch-on time of the IGBT 108.

Furthermore, the commutation phase starts when the gate voltage ($V_g$) reaches the threshold voltage corresponding to the IGBT 108 and ends when the current flowing through the freewheeling diode 116 ($I_D$) (e.g., the commutation current) reaches a maximum value in negative direction. The current flowing through the freewheeling diode 116 has negative values when the freewheeling diode goes in a blocking mode. Moreover, as previously noted, the current flowing through the IGBT 108 is the sum of the current flowing to the load 132 and the current flowing through the freewheeling diode 116. The current flowing through the load 132 is constant during the commutation phase. Therefore, to protect the freewheeling diode 116 and to limit control electromagnetic emissions, the slew rate of the current flowing through the freewheeling diode 116 ($I_D$) needs to be controlled. Thus, a higher value of the gate resistor 122 is required. As noted previously, the gate resistor 122 is selected such that the slew rate of the current flowing through the freewheeling diode 116 ($I_D$) is maintained at a low value to protect the freewheeling diode 116. However, in such a configuration when the gate resistor 122 is hard configured, the slew rate of the current flowing through the freewheeling diode 116 ($I_D$) may also be affected by one or more of a change in the DC-link voltage, the current flowing through the load 132, and junction temperatures in the IGBT 108. The duration of the commutation phase is represented by reference numeral 212.

The saturation phase starts at the end of the commutation phase and ends when the IGBT 108 reaches the ON-state. The duration of the saturation phase is represented by reference numeral 214. During the saturation phase 214, the value of the collector to emitter voltage ($V_{CE}$) of the IGBT 108 decreases from close to the DC-link voltage level to a low level such as a voltage value equivalent to the forward voltage drop of the IGBT 108. The slew rate of the collector to emitter voltage ($V_{CE}$) is controlled by the value of the gate resistor 122. For example, higher the resistance of the gate resistor 122, lower is the slew rate of the collector to emitter voltage ($V_{CE}$). However, the stress on the freewheeling diode 116 is independent of the slew rate of the collector to emitter voltage ($V_{CE}$). Therefore, a high slew rate of the collector to emitter voltage ($V_{CE}$) is desired to reduce the switching losses and expeditiously transitioning the IGBT 108 to the ON-state. However, the gate resistor 122 is chosen to have a high enough value (e.g., 5 ohms) to limit the slew rate of the current flowing through the freewheeling diode 116 in the commutation phase 212. Due to the high value of the resistance of the gate resistor 122, the slew rate of the collector to emitter voltage ($V_{CE}$) is lower than it could be if only the behaviour in the saturation phase had to be optimized. Consequently, the duration of the saturation phase is also substantially larger as depicted in FIG. 2. The large duration of the saturation phase also contributes to an increase in the switch-on time of the IGBT 108.

Therefore, use of a fixed value of the gate resistor 122 which is chosen to protect the freewheeling diode 116 results in an increase in the overall switch-on time of the IGBT 108. The increase in the switch-on time of the IGBT 108 in turn limits the use of the inverter circuit 100 that includes such IGBTs in high frequency applications.

Figure 3:
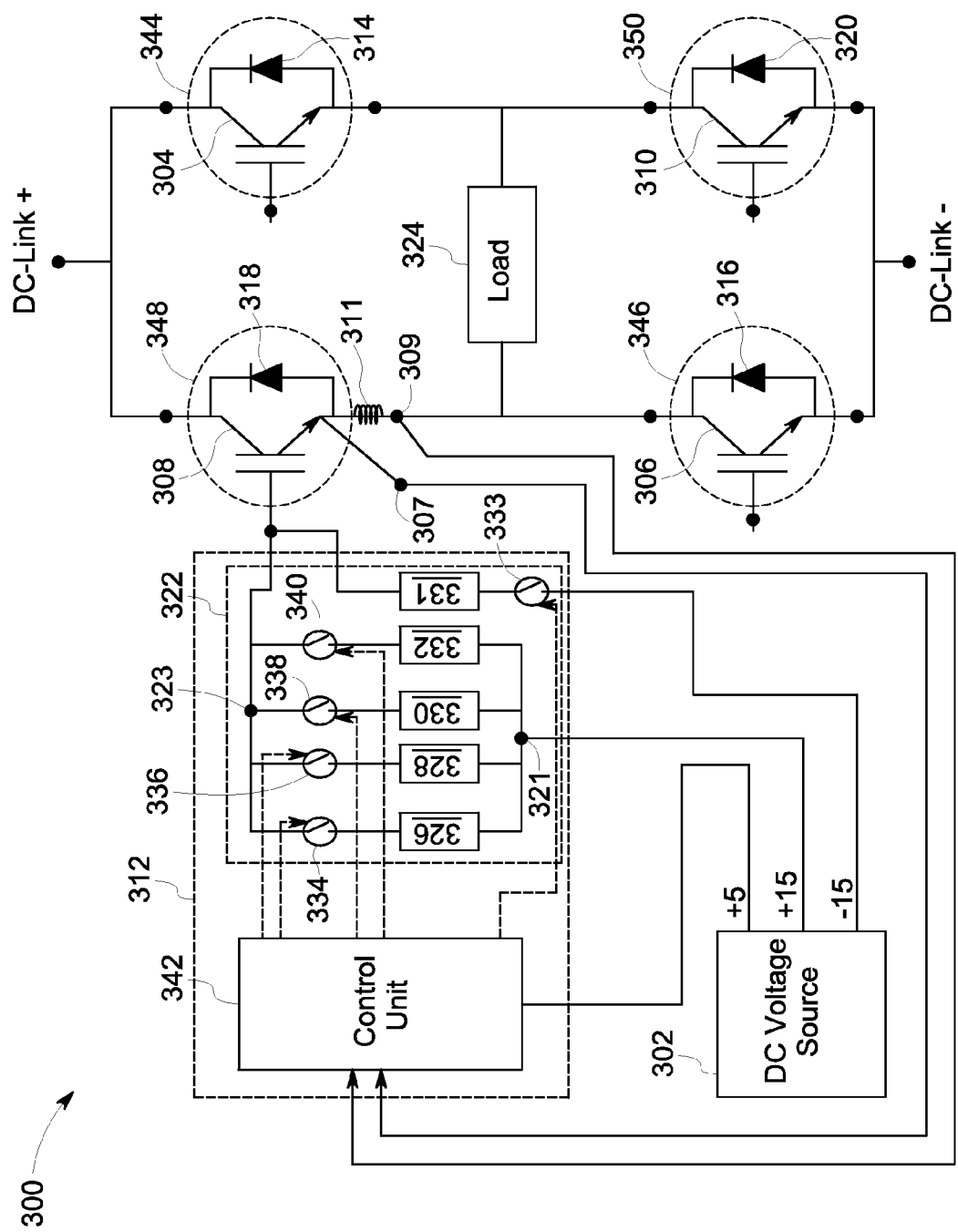
FIG. 3 is a schematic diagram of an inverter circuit employing an exemplary gate driver circuit, in accordance with aspects of the present specification.

FIG. 3 is a schematic diagram of an inverter circuit 300 employing an exemplary gate driver circuit, in accordance with aspects of the present specification. Use of the exemplary gate driver circuit aids in circumventing the shortcomings of the currently available inverter circuits.

The inverter circuit 300 of FIG. 3 includes an arrangement of a direct current (DC) voltage source 302 and one or more power switch modules, such as IGBT modules 344, 346, 348, and 350. The IGBT modules 344, 346, 348, and 350 may be collectively referred to as IGBT modules 344-350. The DC voltage source 302 is similar to the DC voltage source 102 of FIG. 1 and may be configured to supply more than one voltage levels. For example, output voltage levels from the DC voltage source 302 may include voltages of −15 volts and +15 volts, and a biasing voltage for a gate driver circuit 312. In the embodiment of FIG. 3, the DC voltage source 302 is shown external to the gate driver circuit 312. However, in some embodiments, the DC voltage source 302 may form a part of the gate driver circuit 312.

The IGBT modules 344-350 may have a configuration that is substantially similar to the configuration of the IGBT modules 124-130 of FIG. 1. For example, the IGBT modules 344, 346, 348, and 350 may also include IGBTs 304, 306, 308, and 310, respectively. Moreover, the IGBT modules 344, 346, 348, and 350 may also include freewheeling diodes 314, 316, 318, and 320 coupled in antiparallel with the IGBTs 304, 306, 308, 110, respectively. The IGBTs 304, 306, 308, and 310 may be collectively referred to as IGBTs 304-310. Moreover, each of the IGBTs 304-310 may also include a kelvin emitter terminal coupled to a respective power emitter terminal. For ease of illustration a kelvin emitter terminal 307 and a power emitter terminal 309 corresponding to only one IGBT such as the IGBT 308 is depicted in FIG. 3.

In the inverter circuit 300, the IGBT modules 344-350 are coupled in a standard H-bridge inverter configuration. Moreover, a load 324 is coupled to the IGBT modules 344-350 of the inverter circuit 300 as depicted in FIG. 3. In some embodiments, the operation of the inverter circuit 300 may be similar to the operation of the inverter circuit 100 of FIG. 1. Although the embodiment of FIG. 3 shows the IGBT modules 344-350 as being coupled in the standard H-bridge inverter configuration, use of other configurations such as a half bridge inverter configuration is also contemplated.

In one embodiment, the inverter circuit 300 may further include one or more gate driver circuits, such as the gate driver circuit 312 coupled to a gate terminal of an IGBT. In the embodiment of FIG. 3, the inverter circuit 300 is shown as including one gate driver circuit 312 operably coupled to the IGBT 308 for the ease of illustration. Additional gate driver circuits may also be used with the other IGBTs 304, 306, and 310. Moreover, in yet another embodiment, a common gate driver circuit may be implemented for controlling the switching of the IGBTs 304-310. In addition, although the IGBTs 304-310 are depicted as power switches in the embodiment of FIG. 3, other types of semiconductor devices including, but not limited to, a reverse conducting IGBT, BiGT, or MOSFET may be used as the power switches without departing from the scope of the present specification.

In a presently contemplated configuration, the gate driver circuit 312 includes a resistor network 322 coupled to the gate terminal of the IGBT 308. More particularly, a first terminal 321 of the resistor network 322 is coupled to a positive gate voltage supply terminal of the DC voltage source 302. In one example, the DC voltage source 302 may be configured to supply +15 volts from the positive gate voltage supply terminal. Moreover, a second terminal 323 of the resistor network 322 is coupled to the gate terminal of the IGBT 308. The resistor network 322 includes a plurality of resistors, such as resistors 326, 328, 330, and 332 coupled between the first terminal 321 and the second terminal 323 of the resistor network 322. Although the embodiment of FIG. 3 depicts the resistor network 322 as including four resistors 326, 328, 330, and 332, greater or lower number of resistors may also be used without departing from the scope of the present specification. The values of the resistors 326, 328, 330, and 332 may be same or different.

Additionally, in one embodiment, the gate driver circuit 312 may include a turn-off resistor 331. One terminal of the turn-off resistor 331 may be coupled to the gate terminal of the IGBT 308. The other terminal of the turn-off resistor 331 may be coupled to a negative gate voltage supply terminal of the DC voltage source 302 via a switch 333. In one example, the DC voltage source 302 may be configured to supply −15 volts from the negative gate voltage supply terminal. Although the example embodiment of FIG. 3 depicts use of one turn-off resistor 331, another resistor network such as the resistor network 322 may be used between the gate terminal of the IGBT 308 and the negative gate supply voltage terminal of the DC voltage source 302.

Furthermore, the resistor network 322 may also include switches 334, 336, 338, and 340 electrically coupled in series with the resistors 326, 328, 330, and 332, respectively. In one example, the switches 333, 334, 336, 338, and 340 are MOSFETs. One or more of the switches 334, 336, 338, and 340, when closed (e.g., in ON-state), enables parallel coupling of the respective resistors. Therefore, a resistance value provided by the resistor network 322 (hereinafter also referred to as an equivalent resistance of the resistor network 322) at the gate terminal of the IGBT 308 is a parallel equivalent of the resistors that are coupled in parallel. By the way of example, if all of the switches 334, 336, 338, and 340 are closed, the equivalent resistance ($R_{EQ}$) of the resistor network 322 may be determined using equation (1).

$$\frac{1}{R_{EQ}} = \frac{1}{R_{326}} + \frac{1}{R_{328}} + \frac{1}{R_{330}} + \frac{1}{R_{332}} \qquad (1)$$

where, $R_{326}$, $R_{328}$, $R_{330}$, and $R_{332}$ represent resistance values of the resistors 326, 328, 330, and 332, respectively.

Similarly, in another example, if the switches 334 and 336 are closed and the switches 338 and 340 are open, the equivalent resistance ($R_{EQ}$) of the resistor network 322 may be determined using equation (2).

$$\frac{1}{R_{EQ}} = \frac{1}{R_{326}} + \frac{1}{R_{328}} \qquad (2)$$

With continuing reference to FIG. 3, the gate driver circuit 312 may further include a control unit 342. In one example, the control unit 342 may be implemented using a controller such as a field-programmable gate array (FPGA). In another example, the control unit 342 may be implemented as an application-specific integrated circuit (ASIC). In yet another example, the control unit 342 may be implemented using a micro-controller or processor. In one embodiment, the control unit 342 may also include a storage medium such as memory (not shown).

Moreover, in one embodiment, the control unit 342 may receive a biasing voltage from the DC voltage source 302. The control unit 342 may be operatively coupled to the resistor network 322 and the turn-off resistor 331. More particularly, the control unit 342 may be operatively coupled to the switches 334, 336, 338, 340, and 333. Where the switches include MOSFETs, the control unit 342 may be operatively coupled to gate terminals of the MOSFETs. The control unit 342 may be configured to control the resistor network 322 by selectively operating (for example, closing and opening) the switches 334, 336, 338, and 340 such that the resistor network 322 may provide different values of equivalent resistance in at least two of the delay phase, the commutation phase, and the saturation phase when the IGBT 308 is being transitioned to an ON-state.

During operation of the inverter circuit 300, in order to selectively operate the switches 334, 336, 338, and 340, the control unit 342 is configured to determine an occurrence (for example, start) of the delay phase, the commutation phase, or the saturation phase. In one embodiment, the control unit 342 is configured to determine that the delay phase has been initiated when the gate voltage ($V_g$) at the gate terminal of the IGBT 308 starts to rise.

In one embodiment of the present specification, in case of an open loop control mode of the gate driver circuit 312, the control unit 342 is configured to determine the occurrence of the commutation phase and/or the saturation phase via use of a look-up table. The look-up table may include information including, but not limited to, typical start times of the commutation phase and the saturation phase corresponding to various power switches. More particularly, the look-up table may include start times of the commutation phase and the saturation phase along with corresponding model numbers (hereinafter also referred to as identity) of the IGBT 308. In addition, a desired value of the equivalent resistance of the resistor network 322 may also be stored in the look-up table for each of the delay phase, the commutation phase, or the saturation phase corresponding to the model numbers. Table 1 is an example look-up table that may be used by the control unit 342 to selectively operate the switches 334, 336, 338, and 340.

TABLE 1

| Model Number (identity of IGBT) | Phase | Start Time (μ-seconds after application of $V_g$) | Desired value of the equivalent resistance of the resistor network 322 (Ω) |
|---|---|---|---|
| #1 | Delay | 0 | 1 |
| #1 | Commutation | 2.5 | 1.5 |
| #1 | Saturation | 4 | 0.5 |
| #2 | Delay | 0 | 1.5 |
| #2 | Commutation | 3 | 5 |
| #2 | Saturation | 4.5 | 1 |

In one embodiment, prior to implementing the control unit 342 for operation, the look-up table may be stored in the memory associated with the control unit 342. Also, a model number of the IGBT may also be stored in the memory.

During the operation of the inverter circuit 300, for example, when it is desirable to transition the IGBT 308 to on the ON-state, the control unit 342 may be configured to determine a desired value of the equivalent resistance of the resistor network 322 corresponding to the delay phase based on the look-up table for a given model number of the IGBT 308. For example, if the model number of the IGBT 308 is #1, the control unit 342 may be configured to determine that the desired value of the equivalent resistance of the resistor network 322 corresponding to the delay phase is 1 ohm based on the look-up table such as Table-1.

Moreover, the control unit 342 may be configured to selectively operate the switches 334, 336, 338, and 340 to set the equivalent resistance of the resistor network 322 at the desired value. For example, in the delay phase for the IGBT 308, the control unit 342 may be configured to selectively switch one or more of the switches 334, 336, 338, and 340 between an ON-state and an OFF-state such that the equivalent resistance of the resistor network 322 is set at 1 ohm. In one example, when the switches 334, 336, 338, and 340 are MOSFETs, the switches 334, 336, 338, and 340 may be switched on and/or switched off by providing appropriate voltages at respective gate terminals of the switches 334, 336, 338, and 340. As will be appreciated, n-channel MOSFETs and p-channel MOSFETs require different polarities of gate voltages to be switched on and switched off. Once, the equivalent resistance of the resistor network 322 is set at the desired value corresponding to the delay phase, the gate ($V_g$) starts to rise. A time at which the gate voltage ($V_g$) starts rising is hereinafter referred to as time $T_1$.

In one embodiment of the present specification, the control unit 342 may be configured to operate in the open loop control mode. In the open loop control mode, the start of the commutation phase and/or the saturation phase may be determined based on a time elapsed after time $T_1$. By way of example, in the open loop control mode, the control unit 342 may be configured to monitor a time elapsed after the time $T_1$. The control unit 342 may also be configured to determine the start of the commutation phase and the saturation phase when the time elapsed exceeds the corresponding start times of the commutation phase and the saturation phase stored in the look-up table.

In another embodiment of the present specification, the control unit 342 may be configured to operate in a closed loop control mode. In the closed loop control mode, the kelvin emitter terminal 307 and the power emitter terminal 309 of the IGBT 308 may be coupled to the gate driver circuit 312. More particularly, the kelvin emitter terminal 307 and the power emitter terminal 309 may be coupled to the control unit 342. Similarly, the kelvin emitter terminals (not shown) and power emitter terminals of the other IGBTs 304, 306, and 310 may also be coupled to respective control units in the gate driver circuits associated with the IGBTs 304, 306, and 310.

Furthermore, in the closed loop control mode, the start of the commutation phase and the saturation phase may be determined based on a value of a voltage ($V_{kpe}$) between the kelvin emitter terminal 307 and the power emitter terminal 309 of the IGBT 308. For example, in the closed loop control mode, the control unit 342 may be configured to monitor the voltage ($V_{kpe}$) between the kelvin emitter terminal 307 and power emitter terminal 309. As will be appreciated, the voltage ($V_{kpe}$) may be indicative of a derivative ($dI_{CE}/dt$) of a collector to emitter current ($I_{CE}$) of the IGBT 308. In addition, the voltage ($V_{kpe}$) may represent the voltage across a parasitic inductance 311. Moreover, in one embodiment, the control unit 342 may be further configured to compare the value of the voltage ($V_{kpe}$) with a first threshold value and a second threshold value to determine the start of the commutation phase and the saturation phase, respectively. The first threshold value may be indicative of the start of the commutation phase and the second threshold value may be indicative of the start of the saturation phase. In another embodiment, only one threshold value may be used. For instance, if the value of the voltage ($V_{kpe}$) exceeds the threshold value, the control unit 342 may be configured to determine that the commutation phase has started. However, if the value of the voltage ($V_{kpe}$) falls below the threshold value, the control unit 342 may be configured to determine that the saturation phase has started.

In some embodiments, in the closed loop control mode, the start of the commutation phase and the saturation phase for the IGBT 308 may be determined based on a value of the gate voltage ($V_g$) of the IGBT 308. In such an instance, the gate terminal of the IGBT 308 may be coupled (not shown) to the control unit 342. The control unit 342 may be configured determine the start of the commutation phase and the saturation phase when the value of the gate voltage ($V_g$) of the IGBT 308 exceeds a third threshold value and a fourth threshold value, respectively. The third threshold value may be indicative of the start of the commutation phase and the fourth threshold value may be indicative of the start of the saturation phase.

Moreover, in certain embodiments, in the closed loop control mode, the start of the commutation phase for the IGBT 308 may be determined based on a value of a collector to emitter voltage ($V_{CE}$) of the IGBT 308. In such an instance, the collector terminal and/or the power emitter terminal 309 of the IGBT 308 may be coupled (not shown) to the control unit 342. The control unit 342 may be configured to determine the start of the commutation phase when the value of collector to emitter voltage ($V_{CE}$) of the IGBT 308 starts decreasing.

In yet another embodiment of the present specification, the control unit 342 may be configured to operate in a hybrid mode. In the hybrid mode, the kelvin emitter terminal 307 and the power emitter terminal 309 may be coupled to the gate driver circuit 312. More particularly, the kelvin emitter terminal 307 and power emitter terminal 309 may be coupled to the control unit 342. Similarly, the kelvin emitter terminals and power emitter terminals of the other IGBTs 304, 306, and 310 may also be coupled to respective control units in the gate driver circuits associated with the IGBTs 304, 306, and 310.

In the hybrid mode, the start of the commutation phase and the saturation phase may be determined based on the value of the voltage ($V_{kpe}$) between the kelvin emitter terminal 307 and power emitter terminal 309 and/or the time elapsed after the time $T_1$. In one embodiment, the control unit 342 may be configured to monitor both the time elapsed after the time $T_1$ and the voltage ($V_{kpe}$) between the kelvin emitter terminal 307 and power emitter terminal 309. Additionally, the control unit 342 may also be configured to determine the start of the commutation phase and the saturation phase using the approaches employed in the open loop control mode and the closed loop control mode. Earlier of the two start times for a particular phase (for example, the commutation phase or the saturation phase) thus determined may be identified as the start time of the particular phase. For example, if the start time of the commutation phase determined based on the voltage ($V_{kpe}$) is later than the start time of the commutation phase determined based on the time elapsed, the control unit 342 may be configured to identify the start time determined based on the voltage ($V_{kpe}$) as the start time of the commutation phase.

Moreover, the control unit 342 may also be configured to determine the desired values of the equivalent resistance of the resistor network 322 corresponding to the commutation phase and the saturation phase based on the model number of the IGBT 308. For example, the desired values of the equivalent resistance of the resistor network 322 in the commutation phase and the saturation phase are 1.5 ohms and 0.5 ohms, respectively. Details of determining the desired value of the equivalent resistance of the resistor network 322 corresponding to each of the commutation phase and the saturation phase will be described in greater detail in conjunction with FIGS. 9A and 9B.

Additionally, for each of the commutation phase and the saturation phase, the control unit 342 may also be configured to selectively operate the switches 334, 336, 338, and 340 to set the equivalent resistance of the resistor network 322 to the desired value. As previously noted, in one embodiment, the desired value of the equivalent resistance of the resistor network 322 may be obtained using the look-up table. The details of selectively operating the switches 334, 336, 338, and 340 in each of the commutation phase and the saturation phase will be described in greater detail in conjunction with FIGS. 9A and 9B. Moreover, as will be appreciated, once the switches 334, 336, 338, and 340 are selectively operated to set the equivalent resistance of the resistor network 322 to the desired value in any of the delay phase, commutation phase, and saturation phase, a driving strength (e.g., a gate current) is supplied to the gate terminal of the IGBT 308. The value of the driving strength may be based on an instantaneous value of the equivalent resistance of the resistor network 322.

In one embodiment, the control unit 342 may be configured to set the equivalent resistance of the resistor network 322 during the delay phase to a lower value when compared to the equivalent resistance of the resistor network 322 during the commutation phase. Consequently, the gate voltage ($V_g$) may reach the threshold voltage of the IGBT 308 faster. Such a fast raise of the gate voltage ($V_g$) aids in lowering the duration of the delay phase (hereinafter also referred to as a dead time). Also, the control unit 342 may be configured to set the equivalent resistance of the resistor network 322 during the saturation phase to a lower value when compared to the equivalent resistance of the resistor network 322 during the commutation phase. Consequently, the slew rate of the collector to emitter voltage ($V_{CE}$) of the IGBT 308 is higher when compared to the slew rate of the collector to emitter voltage ($V_{CE}$) of the IGBT 108. This increase in the slew rate of the collector to emitter voltage ($V_{CE}$) in the saturation phase also aids in lowering the duration of the saturation phase. Moreover, the use of higher resistance values in the commutation phase aids in a maintaining lower slew rate of the current flowing through the freewheeling diode 316, thereby reducing the stress of the freewheeling diode 316. Thus, the freewheeling diode 316 is also protected during the commutation phase.

Figure 4:
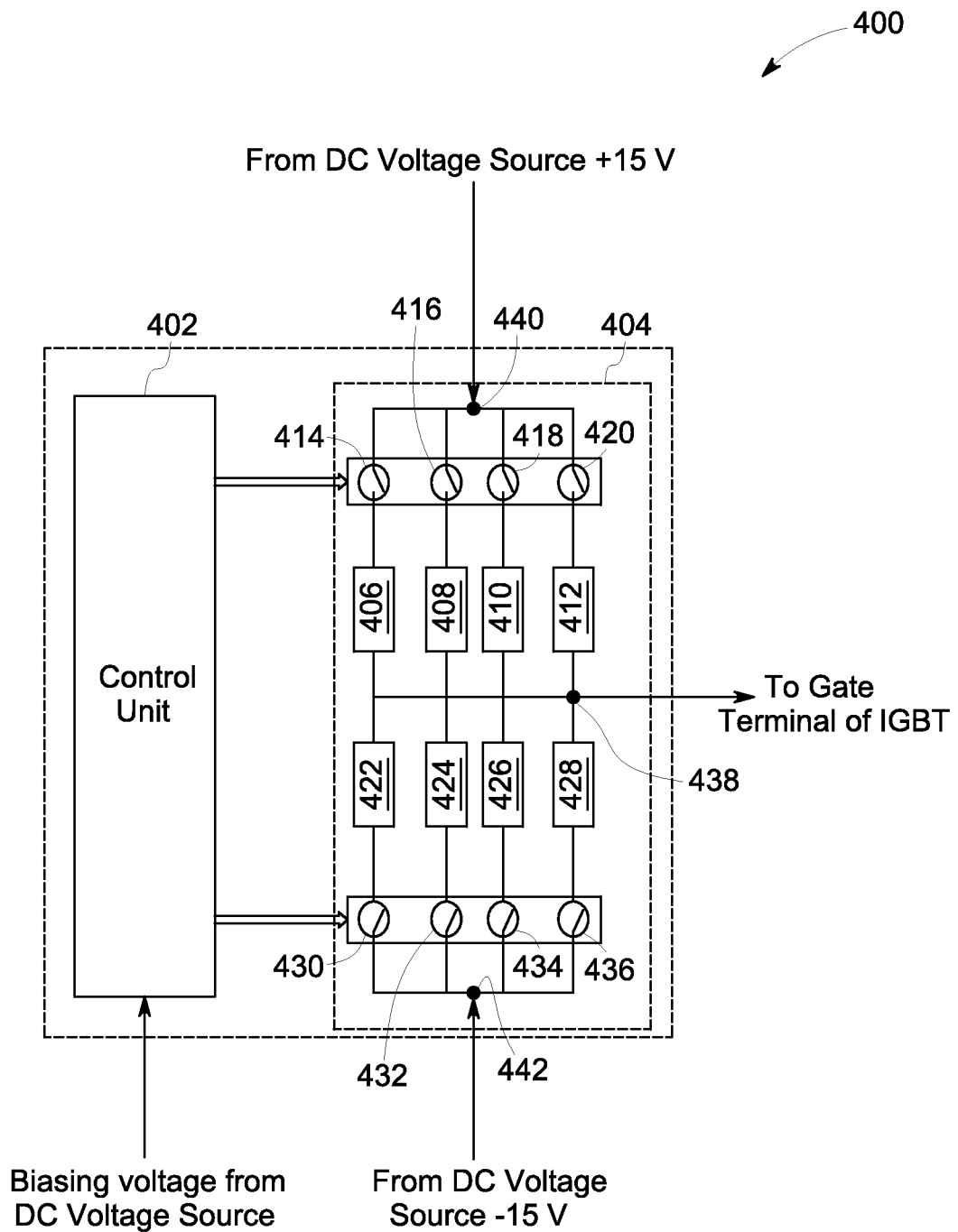
FIG. 4 is a schematic diagram of another embodiment of a gate driver circuit, in accordance with aspects of the present specification.

FIG. 4 is a schematic diagram of another embodiment of a gate driver circuit, in accordance with aspects of the present specification. In particular, a gate driver circuit 400 of FIG. 4 presents another embodiment of the gate driver circuit 312 of FIG. 3. Accordingly, in one embodiment, the gate driver circuit 400 may be employed in the inverter circuit 300 of the FIG. 3 in place of the gate driver circuit 312. FIG. 4 is described in conjunction with the components of FIG. 3.

The gate driver circuit 400 may include a control unit 402. In some embodiments, the operation of the control unit 402 may be substantially equal to the operation of the control unit 342 of FIG. 3. In addition to providing variable resistances during the transition of an IGBT, such as the IGBT 308 to an ON-state, the gate driver circuit 400 may also be configured to provide variable resistances during the transition of the IGBT 308 to a second state. In one embodiment, the second state is an OFF-state.

The gate driver circuit 400 may include a resistor network 404 having a first terminal 440 and a second terminal 442. In addition to resistors 406, 408, 410, and 412, and switches 414, 416, 418, and 420, the resistor network 404 may also include resistors 422, 424, 426, and 428 and corresponding switches 430, 432, 434, and 436. The switches 414, 416, 418, and 420 are respectively coupled in series with the resistors 406, 408, 410, and 412. Also, the switches 430, 432, 434, and 436 are respectively coupled in series with the resistors 422, 424, 426, and 428. The switches 414, 416, 418, 420, 430, 432, 434, and 436 may be selectively operated by the control unit 402.

Furthermore, first ends of the resistors 406, 408, 410, 412, 422, 424, 426, and 428 may be coupled at a common junction 438, as depicted in FIG. 4. In a presently contemplated configuration, the common junction 438 is coupled to the gate terminal of the IGBT 308 (not shown in FIG. 4). Second ends of the resistors 406, 408, 410, and 412 are coupled to the first terminal 440 of the resistor network 404 via the switches 414, 416, 418, and 420, respectively. The first terminal 440 of the resistor network 404 may be coupled to a positive gate voltage supply terminal of a DC voltage source such as the DC voltage source 302. Moreover, second ends of the resistors 422, 424, 426, and 428 are coupled to the second terminal 442 of the resistor network 404 via the switches 422, 424, 426, and 428, respectively. The second terminal 442 of the resistor network 404 may be coupled to the negative gate voltage supply terminal of the DC voltage source.

When the IGBT 308 is being transitioned to the ON-state, the control unit 402 may be configured to open the switches 430, 432, 434, and 436. Moreover, the control unit 402 may be configured to selectively operate the switches 414, 416, 418, and 420 to provide different values of equivalent resistance in the delay phase, the commutation phase, and the saturation phase when the IGBT 308 is being transitioned to the ON-state.

In a similar fashion, when the IGBT 308 is being transitioned to the OFF-state, the control unit 402 may be configured to open the switches 414, 416, 418, and 420. The control unit 402 may also be configured to selectively operate the switches 430, 432, 434, and 436 to provide different values of equivalent resistance during various phases when the IGBT 308 is being transitioned to the OFF-state.

By implementing the gate driver circuit in this fashion, in addition to providing variable resistances during the transition of the IGBT to the ON-state, variable resistances may also be provided during the transition of the IGBT the OFF-state. Consequently, both the switch-on time and the switch-off time of the IGBT may be lowered to achieve faster switching of the IGBT.

Figure 5:
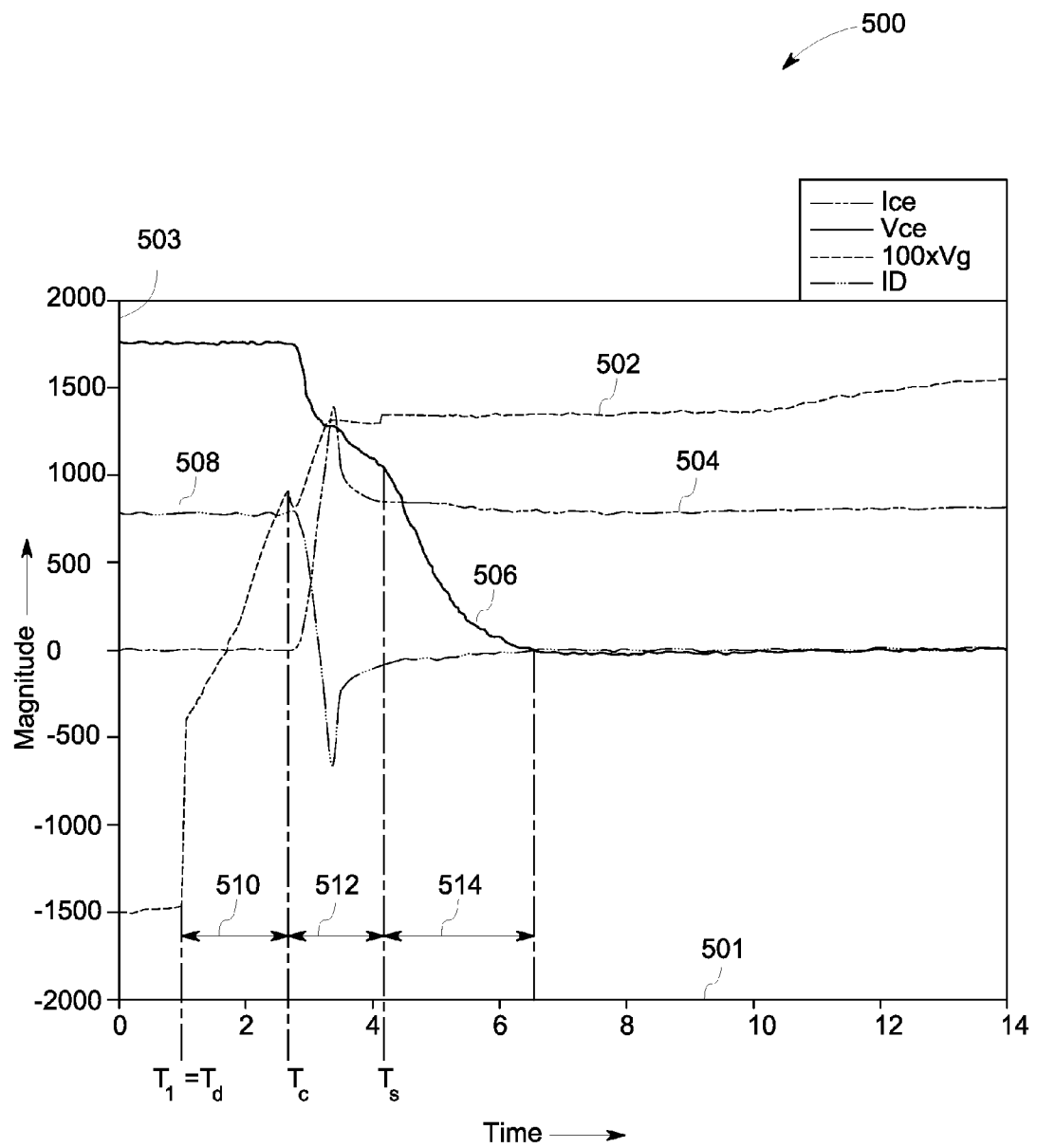
FIG. 5 is a graphical illustration of time responses of various parameters of a power switch in an open loop control mode, in accordance with aspects of the present specification.

FIG. 5 is a graphical illustration 500 showing time responses corresponding to various parameters of a power switch module, such as the IGBT module 348 of FIG. 3 when the IGBT 308 is transitioned to the ON-state, in accordance with aspects of the present specification. More particularly, the time responses as depicted in FIG. 5 may be obtained when the control unit 342 is configured to operate in an open loop control mode. For ease of illustration, only the time responses corresponding to the IGBT module 348 are depicted in FIG. 5. Other IGBT modules 344, 346, 350 may also have similar time responses.

The graphical illustration 500 depicts time responses of a gate voltage ($V_g$) 502, a collector to emitter current ($I_{CE}$) 504, and a collector to emitter voltage ($V_{CE}$) 506 of the IGBT 308. The graphical illustration 500 also depicts a time response 508 of a current flowing through the freewheeling diode 316 ($I_D$). Moreover, in the graphical illustration 500, the X-axis 501 represents time in microseconds and the Y-axis 503 represents values of the gate voltage ($V_g$), the collector to emitter current ($I_{CE}$), the collector to emitter voltage ($V_{CE}$) of the IGBT 308, and the current flowing through the freewheeling diode 316 ($I_D$). The time response of the gate voltage ($V_g$) 502 of the IGBT 308 is depicted using scaled up values. In one example, the values of the gate voltage ($V_g$) of the IGBT 308 may be scaled up by about 100. The durations of the delay phase, commutation phase, and the saturation phase are respectively represented by reference numerals 510, 512, and 514. The start times of the delay phase, commutation phase, and the saturation phase are represented by $T_d$ (e.g., $T_1$), $T_c$, and $T_s$. Moreover, as previously noted, the values of the times $T_d$, $T_c$, and $T_s$ may be stored in a look-up table. It may be noted that in comparison to the durations of the delay phase and the saturation phase of the IGBT 108 of FIG. 1, the durations of the delay phase and the saturation phase of the IGBT 308 are substantially lower. This reduction in the durations of the delay phase and the saturation phase of the IGBT 308 is because of the adaptive change in the equivalent resistance of the resistive network 322 in comparison to the fixed value of the gate resistor 122 of FIG. 1.

In some embodiments of the present specification, in a short circuit situation, the collector to emitter current ($I_{CE}$) of the IGBT 308 may start to rise to higher values. For example, the collector to emitter current ($I_{CE}$) of the IGBT 308 may rise upto a level of a short circuit current limit of the IGBT 308. In such a case, if the change of the equivalent resistance of the resistor network 322 is initiated at the start of the saturation phase as depicted in FIG. 5, oscillations in the collector to emitter current ($I_{CE}$) of the IGBT 308 may be reduced, thereby protecting the IGBT 308 during the short circuit situation.

Figure 6:
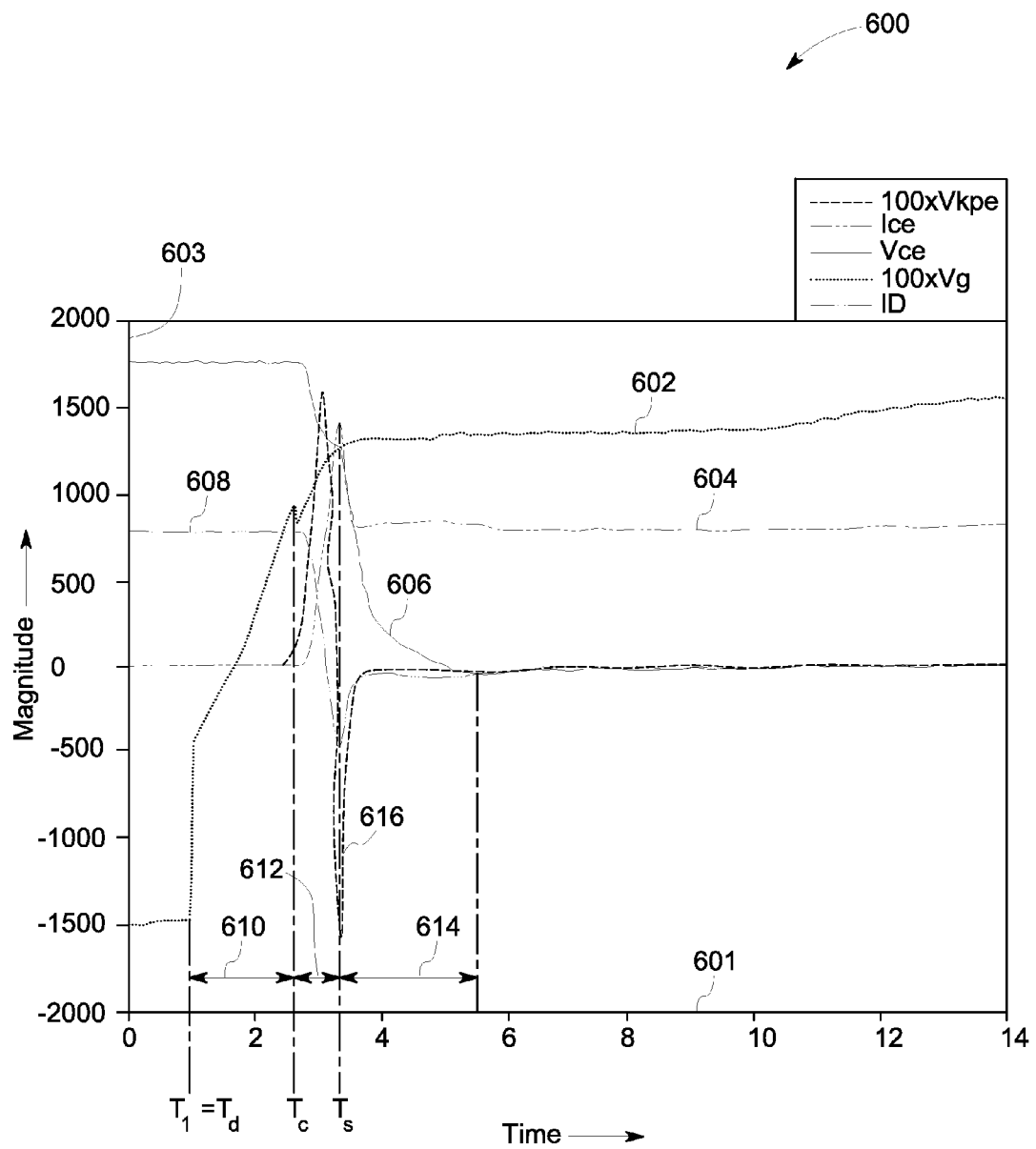
FIG. 6 is a graphical illustration of time responses of various parameters of a power switch in a closed loop control mode, in accordance with aspects of the present specification.

FIG. 6 is a graphical illustration 600 showing another set of time responses corresponding to various parameters of a power switch module, such as the IGBT module 348 when the IGBT 308 is transitioned to an ON-state, in accordance with aspects of the present specification. More particularly, the time responses depicted in FIG. 6 may be obtained when the control unit 342 is configured to operate in the closed loop control mode. As noted previously, in the closed loop control mode, the control unit 342 is configured to determine the start of the commutation phase and the saturation phase based at least on the voltage ($V_{kpe}$) appearing between the kelvin emitter terminal 307 and the power emitter terminal 309. For ease of illustration, only the time responses corresponding to the IGBT module 348 are depicted in FIG. 6. Other IGBT modules 344, 346, 350 may also have similar time responses.

The graphical illustration 600 depicts time responses of a gate voltage ($V_g$) 602, a collector to emitter current ($I_{CE}$) 604, a collector to emitter voltage ($V_{CE}$) 606, and a voltage ($V_{kpe}$) 616 of the IGBT 308. The graphical illustration 600 also depicts a time response 608 of a current flowing through the freewheeling diode 316 ($I_D$). Moreover, in the graphical illustration 600, the X-axis 601 represents time in microseconds and the Y-axis 603 represents values of the gate voltage ($V_g$), the collector to emitter current ($I_{CE}$), the collector to emitter voltage ($V_{CE}$) of the IGBT 308, the voltage ($V_{kpe}$), and the current flowing through the freewheeling diode 316 ($I_D$). The time response of the gate voltage ($V_g$) 602 and the time response of the voltage ($V_{kpe}$) 616 of the IGBT 308 are depicted using scaled up values. In one example, the values of the gate voltage ($V_g$) and the voltage ($V_{kpe}$) of the IGBT 308 may be scaled up by about 100. Moreover, durations of the delay phase, commutation phase, and saturation phase are respectively represented by numerals 610, 612, and 614.

In one embodiment, as depicted in graphical illustration 600, the start of the commutation phase may be triggered when the voltage ($V_{kpe}$) exceeds a first threshold value. For example, the first threshold value may be 2 volts. Moreover, the start of the saturation phase may be triggered when the voltage ($V_{kpe}$) exceeds a second threshold value. By way of example, the second threshold value may be zero (0). The zero value of the voltage ($V_{kpe}$) may be indicative of the value of $dI_{CE}/dt$ being 0 V/μs. In another embodiment, the saturation phase may be triggered when the value of voltage ($V_{kpe}$) falls below the first threshold after the commutation phase has been triggered.

It may be noted that in comparison to the start of the saturation phase in the graphical illustration 500 of FIG. 5, the saturation phase in the graphical illustration 600 of FIG. 6 starts earlier. Consequently, the equivalent resistance of the resistor 322 may also be adjusted earlier than in case of the closed loop control mode of the gate driver circuit 312. Such an early start of the saturation phase may aid in further shortening the duration of the saturation phase, thereby reducing the switching time and switching losses.

Figure 7:
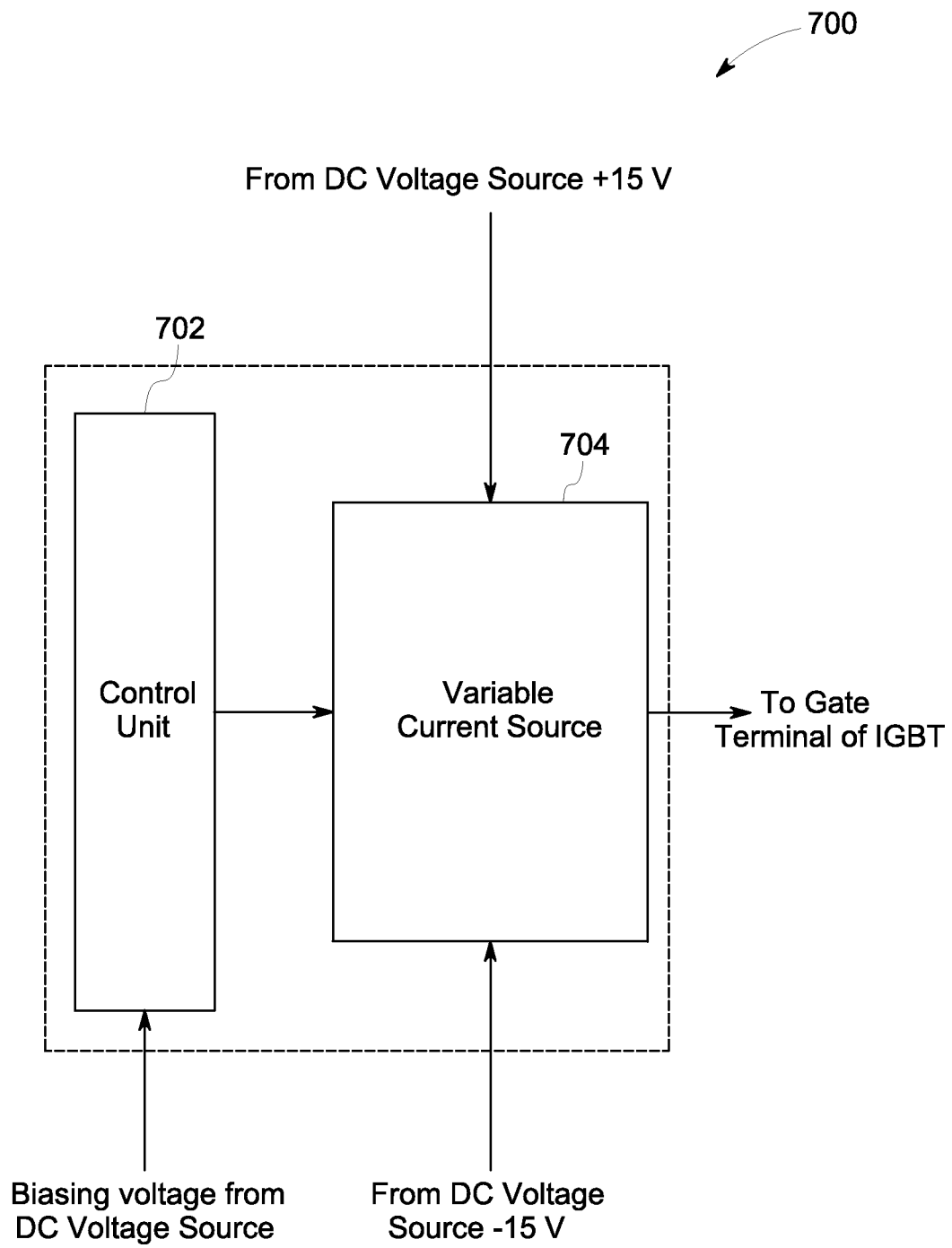
FIG. 7 is a schematic diagram of yet another embodiment of a gate driver circuit, in accordance with aspects of the present specification.

FIG. 7 is a schematic diagram of yet another embodiment of a gate driver circuit, in accordance with aspects of the present specification. In particular, a gate driver circuit 700 of FIG. 7 presents another embodiment of the gate driver circuit 312 of FIG. 3. Accordingly, in one embodiment, the gate driver circuit 700 may be employed in the inverter circuit 300 of the FIG. 3 in place of the gate driver circuit 312. FIG. 7 is described in conjunction with the components of FIG. 3.

The gate driver circuit 700 may include a control unit 702 operatively coupled to a variable current source 704. The variable current source 704 may in turn be coupled to the gate terminal of the IGBT 308. As will be appreciated, the output current of the variable current source 704 may constitute a driving strength of the IGBT 308. The terms driving strength and the gate current may be used interchangeably. The variable current source 704 may be implemented using transistors and/or Operational Amplifiers (Op-amps).

It may be noted that the operation of the control unit 702 may be substantially equal to the operation of the control unit 342 of FIG. 3. For example, the control unit 702 may be configured to determine start times corresponding to the delay phase, commutation phase, and/or saturation phase in any implementation of the gate driver circuit 312 that may operate in an open loop control mode, a closed loop control mode, or a hybrid mode. In the embodiment of FIG. 7, once the start of any of the delay phase, commutation phase, and/or saturation phase is determined, the control unit 702 may be configured to control the variable current source 704 such that a different driving strength is supplied in at least two of the delay phase, commutation phase, and saturation phase when the IGBT 308 is transitioned to the ON-state. More particularly, the control unit 702 may be configured to control the variable current source 704 such that overall time to transition the IGBT 308 to an ON-state is reduced.

In one embodiment, the driving strength supplied by the variable current source 704 to the gate terminal of the IGBT 308 in the delay phase and/or the saturation phase may be higher in comparison to the gate current supplied in the commutation phase, thereby reducing the durations of the delay phase and the saturation phase. Such reductions in the durations of the delay phase and the saturation phase may in turn reduce the overall time to transition the IGBT 308 to the ON-state. Moreover, provision of supplying a lower gate current in the commutation phase aids in maintaining the slew rate of the current flowing through the freewheeling diode 316 at a low value. This low value of the slew rate of the current flowing through the freewheeling diode 316 protects the freewheeling diode 316.

Figure 8:
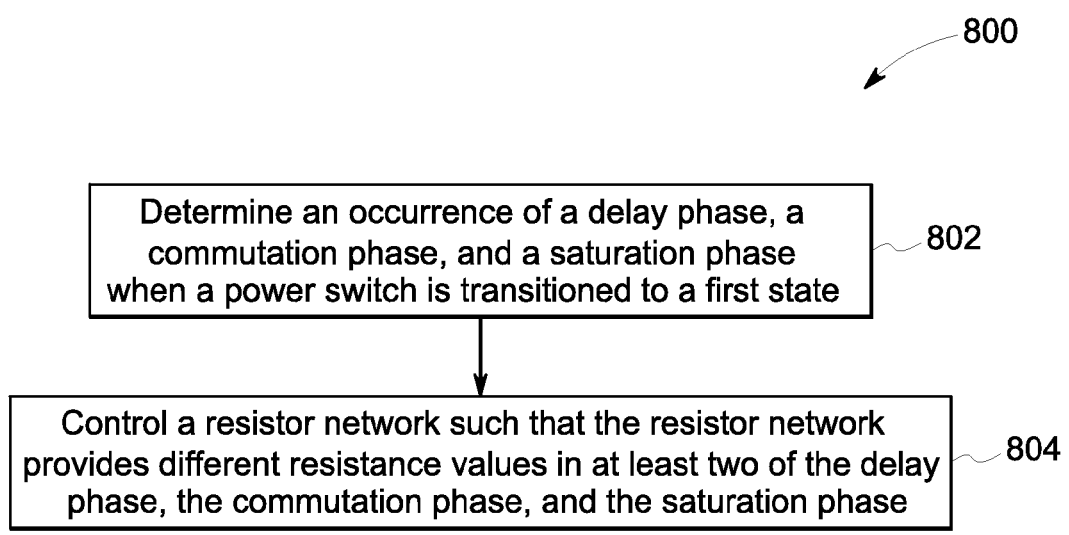
FIG. 8 depicts a flow diagram of an example method for driving a power switch, in accordance with aspects of the present specification.

FIG. 8 depicts a flow diagram 800 illustrating an example method for driving a power switch, such as the IGBT 308 of FIG. 3, in accordance with aspects of the present specification. The flow diagram 800 is described in conjunction with the components of the inverter circuit 300 of FIG. 3. As previously noted, the inverter circuit 300 may include IGBT modules 342-350 and the gate driver circuit 312. Moreover, the IGBT modules include IGBTs 304-310 and freewheeling diodes 314-320. Additionally, the gate driver circuit 312 may include the resistor network 322. Also, the control unit 342 is configured to control the resistor network 322.

At step 802, occurrence of a delay phase, a commutation phase, and a saturation phase may be determined when the power switch, such as the IGBT 308 is being transitioned to a first state. In one embodiment, the first state is an ON-state. The occurrence of the delay phase, the commutation phase, and the saturation phase is determined by the control unit 342 of the gate driver circuit 312. In one embodiment, the occurrence of the delay phase, the commutation phase, and the saturation phase may be determined based on a look-up table. In another embodiment, the occurrence of the delay phase, the commutation phase, and the saturation phase may be determined based on a voltage ($V_{kpe}$) appearing between the kelvin emitter terminal 307 and the power emitter terminal 309 and the look-up table. Further details of step 802 will be described in a flow diagram of FIG. 9.

At step 804, a resistor network, such as the resistor network 322, that is coupled to the IGBT 308 may be controlled such that the resistor network 322 may provide different resistance values in at least two of the delay phase, the commutation phase, and the saturation phase when the IGBT 308 is transitioned to the ON-state. In one embodiment, the resistor network 322 is controlled by the control unit 342 by selectively operating the switches 334, 336, 338, and 340. Further details of step 804 will be described in a flow diagram of FIG. 9.

Figure 9A:
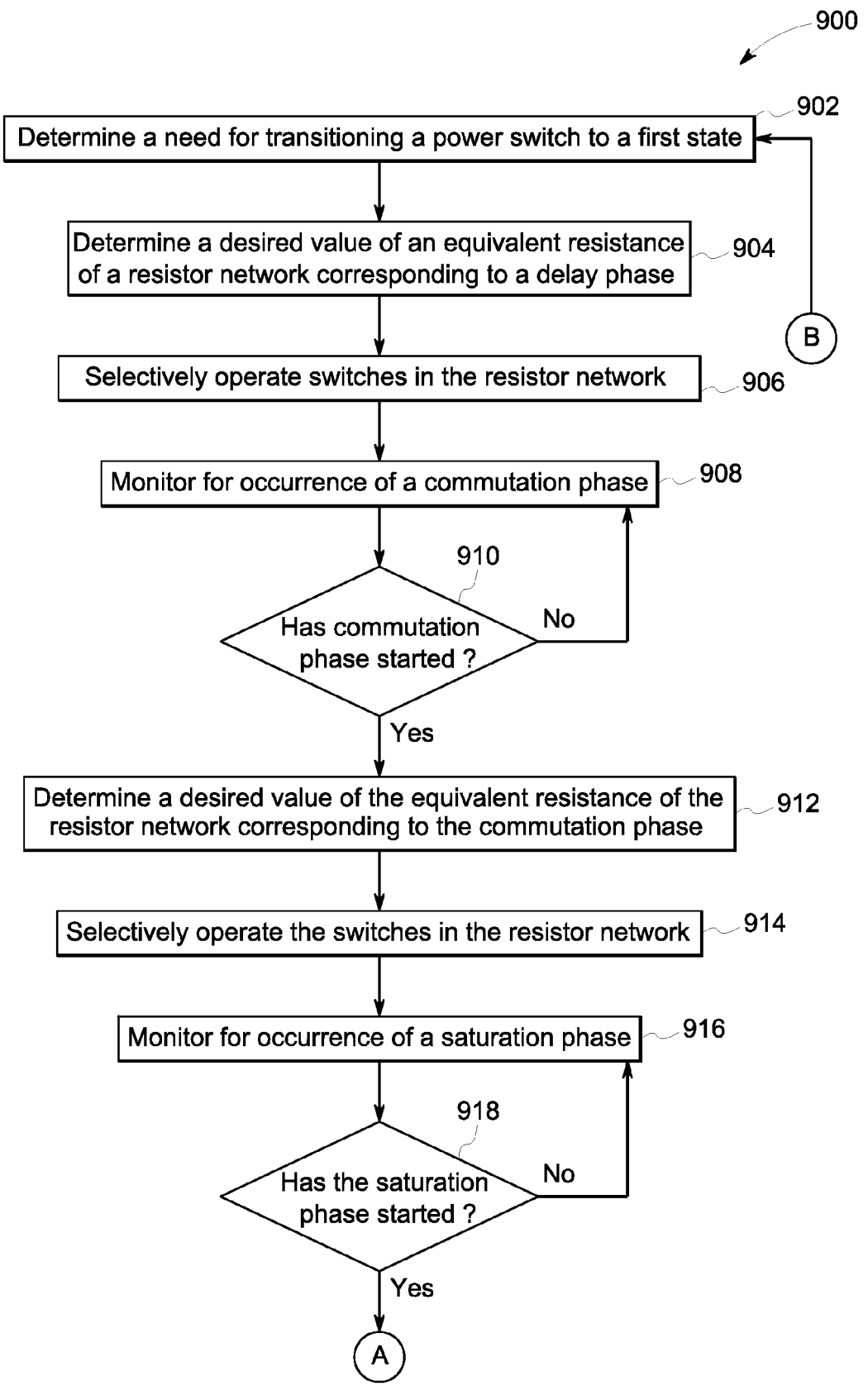
FIGS. 9A and 9B depict a detailed flow diagram of the method of FIG. 8, in accordance with aspects of the present specification.
Figure 9B:
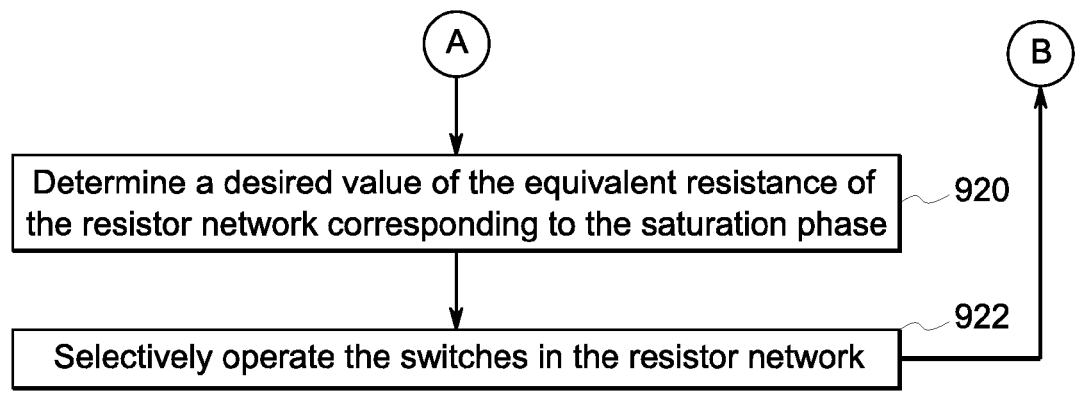

FIGS. 9A and 9B depict a detailed flow diagram 900 of the method of FIG. 8, in accordance with aspects of the present specification. The flow diagram 900 is described in conjunction with the components of the inverter circuit 300 of FIG. 3. As noted previously, prior to implementing the control unit 342 for operation, the control unit 342 is configured to store a look-up table, for example, in memory. Also, the model number of the IGBT (in this example, the IGBT 308) to which the gate driver unit 312 is to be electrically coupled is also stored in the memory associated with the control unit 342. Alternatively, the control unit 342 may be configured to obtain the desired information from a source external to the control unit 342.

During operation of the inverter circuit 300, a need for transitioning a power switch, such as the IGBT 308 to a first state may be determined, as indicated by step 902. In one embodiment, the first state is an ON-state. In one embodiment, the control unit 342 may be used to determine the need for transitioning the IGBT 308 to the ON-state based on a desired period of the AC signal across a load 324. In another embodiment, the control unit 342 may receive a command signal from another controller (not shown), where the command signal is indicative of the need to transition the IGBT 308 to the ON-state.

If it is determined that it is desirable to transition the IGBT 308 to the ON-state, the control unit 342 may be configured to determine a desired value of an equivalent resistance of the resistor network 322 corresponding to a delay phase, as indicated by step 904. In one embodiment, the control unit 342 may be configured to determine the desired value of the equivalent resistance of the resistor network 322 based on the look-up table. For example, if the model number of the IGBT 308 is #1, the control unit 342 may be configured to obtain, from the look-up table, the desired value of the equivalent resistance of the resistor network 322 corresponding to the delay phase as having a value of 1 ohm.

Subsequently, at step 906, the control unit 342 may be configured to selectively operate the switches 334, 336, 338, and 340 in the resistor network 322 such that the equivalent resistance of the resistor network 322 is set to the desired value of 1 ohm. Therefore, a resistance of 1 ohm may be provided to the gate terminal of the IGBT 308 in the delay phase. Once the desired value of the equivalent resistance is provided to the gate terminal of the IGBT 308, a gate voltage ($V_g$) of the IGBT 308 may start to rise. The time at which the gate voltage ($V_g$) starts rising may be referred to as time $T_1$. Once the gate voltage ($V_g$) starts to rise, the control unit 342 may be configured to determine that a delay phase has been initiated. Start times of the delay phase, the commutation phase, and the saturation phase are hereinafter referred to as times $T_d$ (e.g., $T_1$), $T_c$, and $T_s$, respectively. In one embodiment, in case of an open loop control mode of the gate driver circuit 312, the times $T_c$ and $T_s$ for a given model number of the IGBT 308 are stored in the look-up table.

Furthermore, at step 908, the control unit 342 may be configured to determine occurrence of the commutation phase. In one embodiment, in case of the open loop control mode of the gate driver circuit 312, the control unit 342 may be configured to monitor a time elapsed after the time $T_1$. The time elapsed after the time $T_1$ is hereinafter referred to as time $T_i$. In another embodiment, in case of a closed loop control mode of the gate driver circuit 312, the control unit 342 may be configured to monitor a voltage ($V_{kpe}$) appearing between the kelvin emitter terminal 307 and the power emitter terminal 309 of the IGBT 308. In yet another embodiment, in case of a hybrid mode of the gate driver circuit 312, the control unit 342 may be configured to monitor both the time $T_i$ and the voltage ($V_{kpe}$) appearing between the kelvin emitter terminal 307 and power emitter terminal 309 to determine the occurrence of the commutation phase.

Moreover, a check may be carried out by the control unit 342 to determine if the commutation phase has been initiated, as indicated by step 910. In one embodiment, in case of the open loop control mode, the control unit 342 may be configured to compare the time $T_i$ with the time $T_c$ stored in the look-up table. If $T_i$ is equal to $T_c$, the control unit 342 may determine that the commutation phase has started. In another embodiment, in case of the closed loop control mode, the control unit 342 may be configured to compare the value of the voltage ($V_{kpe}$) with a first threshold value (for example, 2 Volts). If the value of the voltage ($V_{kpe}$) exceeds the first threshold value, the control unit 342 may determine that the commutation phase has started. In another embodiment, in the case of the hybrid mode, the control unit 342 may be configured to determine the start of the commutation phase as earlier of the start of the commutation phase determined based on the time $T_i$ and start of the commutation phase determined based on the voltage ($V_{kpe}$).

Once the commutation phase has commenced, the control unit 342 may be configured to determine a desired value of the equivalent resistance of the resistor network 322 corresponding to the commutation phase, as indicated by step 912. In one example, the desired value of the equivalent resistance of the resistor network 322 corresponding to the commutation phase may be obtained from the look-up table. For example, if the model number of the IGBT 308 is #1, the control unit 342 may be configured to determine the desired value of the equivalent resistance of the resistor network 322 in the commutation phase as 1.5 ohms.

Additionally, at step 914, the control unit 342 may be configured to selectively operate the switches 334, 336, 338, and 340 in the resistor network 322. More particularly, the control unit 342 may be configured to selectively operate the switches 334, 336, 338, and 340 such that the equivalent resistance of the resistor network 322 is set to the desired value of the equivalent resistance of the resistor network 322.

Furthermore, at step 916, the control unit 342 may be configured to determine occurrence of the saturation phase. In one embodiment, in case of the open loop control mode, the control unit 342 may be configured to monitor the time $T_i$. In another embodiment, in case of a closed loop control mode, the control unit 342 may be configured to monitor a voltage ($V_{kpe}$) appearing between the kelvin emitter terminal 307 and the power emitter terminal 309 of the IGBT 308. In yet another embodiment, in case of hybrid mode, the control unit 342 may be configured to monitor both the time $T_i$ and the voltage ($V_{kpe}$) appearing between the kelvin emitter terminal 307 and the power emitter terminal 309 of the IGBT 308.

Subsequently, a check may be carried out as depicted by step 918 by the control unit 342 to determine if the saturation phase has been initiated. In one embodiment, in case of the open loop control mode, the control unit 342 may be configured to compare the time $T_i$ with the time $T_s$ stored in the look-up table. If $T_i$ is equal to $T_s$, the control unit 342 may determine that the saturation phase has started. In another embodiment, in case of the closed loop control mode, the control unit 342 may be configured to compare the value of the voltage ($V_{kpe}$) with a second threshold value (for example, 0 Volt). If the value of the voltage ($V_{kpe}$) exceeds the second threshold value, the control unit 342 may determine that the saturation phase has started. In another embodiment, the start of the saturation phase may be determined when the value of the voltage ($V_{kpe}$) falls below the first threshold value after the commutation phase has commenced. In another embodiment, in case of the hybrid mode, the control unit 342 may be configured to determine the start of the saturation phase as later of the start of the saturation phase determined based on the time $T_i$ and start of the saturation phase determined based on the voltage ($V_{kpe}$).

Once the saturation phase has commenced, the control unit 342 may be configured to determine a desired value of the equivalent resistance of the resistor network 322 corresponding to the saturation phase, as indicated by step 920. In one example, the desired value of the equivalent resistance of the resistor network 322 corresponding to the saturation phase may be obtained from the look-up table. For example, if the model number of the IGBT 308 is #1, the control unit 342 may be configured to determine the desired value of the equivalent resistance of the resistor network 322 in the saturation phase as 0.5 ohms.

Additionally, at step 922, the control unit 342 may be configured to selectively operate the switches 334, 336, 338, and 340 in the resistor network 322 such that the equivalent resistance of the resistor network 322 is set to the desired value of the equivalent resistance of the resistor network 322 determined based on the look-up table. Once the equivalent resistance of the resistor network 322 is set to the desired value for the saturation phase, control may be returned to step 902 and steps 902-922 may be repeated as desired.

Furthermore, the foregoing examples, demonstrations, and method steps such as those that may be performed by the controller unit in the gate driver circuit may be stored in the form of suitable code in non-transitory computer readable media. The code may be executed on a processor-based system, such as a general-purpose or special-purpose computer. It should also be noted that different implementations of the present specification may perform some or all of the steps described herein in different orders or substantially concurrently, that is, in parallel. Furthermore, the functions may be implemented in a variety of programming languages, including but not limited to C++ or Java. Such code may be stored or adapted for storage on one or more tangible, computer readable media, such as on data repository chips, local or remote hard disks, optical disks (that is, CDs or DVDs), memory or other media, which may be accessed by a processor-based system to execute the stored code. Note that the tangible media may comprise paper or another suitable medium upon which the instructions are printed. For instance, the instructions may be electronically captured via optical scanning of the paper or other medium, then compiled, interpreted or otherwise processed in a suitable manner if necessary, and then stored in the data repository or memory.

Embodiments of the gate driver circuit and methods for driving a power switch facilitate faster switching of the power switch by reducing the dead time and the duration of the saturation phase. Further, use of the gate driver circuit facilitates reduction in switching losses of the power switch. Moreover, stress on the freewheeling diodes is also reduced.

It will be appreciated that variants of the above disclosed and other features and functions, or alternatives thereof, may be combined to create many other different systems or applications. Various unanticipated alternatives, modifications, variations, or improvements therein may be subsequently made by those skilled in the art and are also intended to be encompassed by the following claims.

The invention claimed is:

1. A gate driver circuit for driving a power switch, the gate driver circuit comprising:
   a resistor network coupled to the power switch, wherein the resistor network comprises a plurality of resistors;
   a control unit operatively coupled to the resistor network and configured to:
   determine an occurrence of a commutation phase and a saturation phase based on an identity of the power switch and corresponding time stamps associated with a start of a delay phase, the commutation phase, and the saturation phase; and
   control the resistor network such that the resistor network provides different resistance values in at least two of the delay phase, the commutation phase, and the saturation phase when the power switch is transitioned to a first state.

2. The gate driver circuit of claim 1, wherein the first state is an ON-state.

3. The gate driver circuit of claim 1, wherein the power switch is disposed in an inverter circuit.

4. The gate driver circuit of claim 1, wherein the power switch comprises at least one of an insulated-gate bipolar transistor (IGBT), a reverse conducting IGBT, a bi-mode insulated gate transistor, and a metal-oxide-semiconductor field-effect transistor.

5. The gate driver circuit of claim 1, wherein the resistor network is coupled to a gate terminal of the power switch.

6. The gate driver circuit of claim 1, wherein the resistor network further comprises a plurality of switches coupled to the plurality of resistors.

7. The gate driver circuit of claim 6, wherein the control unit is operatively coupled to the plurality of switches and configured to selectively transition one or more of the plurality of switches between an ON-state and an OFF-state based on an occurrence of the delay phase, the commutation phase, or the saturation phase.

8. The gate driver circuit of claim 1, wherein the control unit is further configured to control the resistor network such that a resistance value provided by the resistor network in the delay phase or the saturation phase aids in minimizing a duration of the delay phase or the saturation phase.

9. The gate driver circuit of claim 1, wherein the control unit is further configured to control the resistor network such that a resistance value provided by the resistor network in the delay phase or the saturation phase is lower than a resistance value provided by the resistor network in the commutation phase.

10. The gate driver circuit of claim 1, wherein the power switch comprises a freewheeling diode coupled between a collector terminal and an emitter terminal of the power switch.

11. The gate driver circuit of claim 1, wherein the control unit is further configured to obtain values corresponding to time stamps associated with the start of the delay phase, the commutation phase, and the saturation phase, and resistance values corresponding to the time stamps from a look-up table.

12. The gate driver circuit of claim 1, wherein the control unit is further configured to monitor at least one of a gate voltage and a collector to emitter voltage of the power switch to detect the occurrence of the commutation phase and the saturation phase.

13. The gate driver circuit of claim 1, wherein the control unit is further configured to detect the occurrence of the commutation phase and the saturation phase based on a derivative of a current flowing through the power switch.

14. The gate driver circuit of claim 13, wherein the control unit is further configured to monitor a voltage between a kelvin terminal and a power terminal of the power switch, and wherein the voltage between the kelvin terminal and the power terminal of the power terminal is indicative of the derivative of the current flowing through the power switch.

15. A method for driving a power switch, comprising:
   determining an occurrence of a delay phase, a commutation phase, and a saturation phase based on an identity of the power switch and corresponding time stamps associated with a start of a delay phase, the commutation phase, and the saturation phase when the power switch is transitioned to an ON-state; and
   controlling a resistor network coupled to the power switch such that the resistor network provides different resistance values in at least two of the delay phase, the commutation phase, and the saturation phase, wherein the resistor network comprises a plurality of resistors.

16. The method of claim 15, wherein the resistor network further comprises a plurality of switches, and wherein each of the plurality of switches is connected in series with a resistor in the plurality of resistors.

17. The method of claim 15, wherein controlling the resistor network comprises selectively switching on and switching off one or more of the plurality of switches based on the occurrence of the delay phase, the commutation phase, or the saturation phase.

18. The method of claim 15, wherein determining the occurrence of the commutation phase and the saturation phase comprises obtaining the time stamps associated with the commutation phase and the saturation phase, and resistance values corresponding to the time stamps from a look-up table.

19. A gate driver circuit for driving a power switch, the gate driver circuit comprising:
   a variable current source coupled to the power switch and configured to supply a driving strength to the power switch; and
   a control unit operatively coupled to the variable current source and configured to:
   determine an occurrence of a commutation phase and a saturation phase based on an identity of the power switch and corresponding time stamps associated with a start of a delay phase, the commutation phase, and the saturation phase; and
   control the variable current source such that different driving strengths are supplied in at least two of the delay phase, the commutation phase, and the saturation phase when the power switch is transitioned to an ON-state.

20. The gate driver circuit of claim 19, wherein the power switch comprises at least one of an insulated-gate bipolar transistor (IGBT), a reverse conducting IGBT, a bi-mode insulated gate transistor, and a metal-oxide-semiconductor field-effect transistor (MOSFET).

21. The gate driver circuit of claim 20, wherein the driving strength comprises a gate current supplied to respective gate terminals of at least one of the insulated-gate bipolar transistor (IGBT), the reverse conducting IGBT, the bi-mode insulated gate transistor, and the metal-oxide-semiconductor field-effect transistor (MOSFET).

* * * * *